(12) United States Patent
Fleischer et al.

(10) Patent No.: US 7,560,942 B2
(45) Date of Patent: Jul. 14, 2009

(54) PROBE RECEPTACLE FOR MOUNTING A PROBE FOR TESTING SEMICONDUCTOR COMPONENTS, PROBE HOLDER ARM AND TEST APPARATUS

(75) Inventors: Hans-Jurgen Fleischer, Priestewitz (DE); Axel Schmidt, Stolpchen (DE); Stojan Kanev, Sacka (DE); Axel Becker, Dresden (DE)

(73) Assignee: SUSS MicroTec Test Systems GmbH, Sacka (DE)

( * ) Notice: Subject to any disclaimer, the term of this patent is extended or adjusted under 35 U.S.C. 154(b) by 112 days.

(21) Appl. No.: 11/674,208

(22) Filed: Feb. 13, 2007

(65) Prior Publication Data
US 2008/0116911 A1    May 22, 2008

(30) Foreign Application Priority Data
Nov. 17, 2006    (DE) ........................ 10 2006 054 673

(51) Int. Cl.
*G01R 1/067* (2006.01)
(52) U.S. Cl. ..................................... 324/754; 324/762
(58) Field of Classification Search ........................ None
See application file for complete search history.

(56) References Cited

U.S. PATENT DOCUMENTS

| | | | | |
|---|---|---|---|---|
| 4,267,507 A | * | 5/1981 | Guerpont | 324/754 |
| 4,657,016 A | * | 4/1987 | Garito et al. | 606/45 |
| 5,105,148 A | * | 4/1992 | Lee | 324/754 |
| 5,717,328 A | * | 2/1998 | Kerr et al. | 324/149 |
| 5,739,696 A | * | 4/1998 | Herrmann et al. | 324/754 |
| 6,384,615 B2 | * | 5/2002 | Schwindt | 324/754 |

* cited by examiner

*Primary Examiner*—Vinh P Nguyen
(74) *Attorney, Agent, or Firm*—Heslin Rothenberg Farley & Mesiti P.C.

(57) ABSTRACT

To arrange a probe needle in a reproducible manner, ensure reliable contact-connection of the probe needle and ensure that the probe needle is held securely even at high temperatures or test forces, a probe receptacle is provided for mounting a probe for testing semiconductor components. The probe has a probe needle and an essentially prismatic probe shaft. The probe receptacle comprises a base having a socket opening to receive the prismatic probe shaft, surrounded by a base wall. The base wall comprises at least two base wall segments which can be moved toward one another. A probe holder arm having such a probe receptacle, and test apparatus having at least one probe which has such a probe receptacle are also provided.

18 Claims, 2 Drawing Sheets

PROBE RECEPTACLE FOR MOUNTING A PROBE FOR TESTING SEMICONDUCTOR COMPONENTS, PROBE HOLDER ARM AND TEST APPARATUS

BACKGROUND ART

The invention relates to a probe receptacle for mounting a probe for testing semiconductor components to a probe holder arm and to a test apparatus.

In order to test the functionality of semiconductor components, the semiconductor components, which are usually still combined with other semiconductor components and are arranged on a wafer at this point in time, are placed and fastened in a test apparatus, which is provided for this purpose, on a movable test table (chuck). The semiconductor component is then contact-connected using a probe so that measurements can be carried out. The probe, which is in the form of a needle and is also referred to as a probe tip, is usually fastened either to a carrier plate (probe card) or to a probe holder arm (probe arm). In many known test apparatuses, the probe holder arm extends from a probe head, to which the probe holder arm is fastened, into the vicinity of the surface of the chuck or of the wafer which is arranged on the chuck. In these test apparatuses, the probe head which is used to control and move the probe needle is arranged above and beside the chuck, with the result that the probe holder arm extends above and outside the wafer to just in front of the surface of the wafer so that the probe needle can be brought into contact with the surface of the wafer.

In order to fasten the probe needle to the probe holder arm in test apparatuses of the type described above, it is known practice to provide a slot, which runs vertically and into which the probe needle is obliquely inserted and firmly clamped, at the free end of the probe holder arm. However, one disadvantage of this solution is that the vertical slot is not suitable for moving the probe needle into a defined position relative to the probe holder arm in a reproducible manner. The resultant positional variations result in problems when positioning the probe needle during the test and measurement operations.

A probe holder in which the positioning of the probe needle is improved is disclosed, for example, in the German utility model 298 09 568. In this solution, the probe needle is arranged on an angled prismatic probe shaft comprising a dielectric material and is firmly connected to said shaft. Conductor tracks which lead from the end of the probe shaft to the probe needle are arranged on the probe shaft. The probe holder arm has a probe receptacle for receiving the prismatic probe shaft. Contacts for electrically contact-connecting the conductor tracks of the probe shaft are provided inside the probe receptacle. In order to fix the probe shaft in the probe receptacle, provision is made of a spring element which laterally presses onto the probe shaft and in this manner simultaneously establishes the electrical contact between the probe shaft and the contacts which are arranged in the probe receptacle, with the result that the probe needle can be inserted and replaced in a relatively simple manner. The advantages of this solution are, on the one hand, that the probe shaft is guided in the probe receptacle in a relatively exact manner, thus facilitating exact positioning of the probe needle. On the other hand, shielding may also be provided on the probe shaft so that the guard potential can be brought close to the tip of the probe needle. However, it has proven disadvantageous that the clamping of the probe shaft using a spring element is suitable only for transmitting relatively limited clamping forces. In addition, the use of the described probe holder arm may be problematic when tests are intended to be carried out at elevated temperatures or with relatively high test forces and these high temperatures result in a reduction in the spring tension or the test force displaces the probe needle relative to the probe holder arm. Finally, in the proposed design, reliable contact-connection between the conductor tracks of the probe shaft and the contacts of the probe receptacle cannot be ensured in a fault-free manner on account of the relatively small contact areas.

On the basis of this prior art, the object of the present invention is to specify a probe receptacle which overcomes the disadvantages of the prior art and, in particular, makes it possible to arrange a probe needle in a reproducible manner, ensures reliable contact-connection of the probe needle and ensures that the probe needle is held securely even at high temperatures or with high test forces.

SUMMARY OF THE INVENTION

The inventive probe receptacle for mounting a probe for testing semiconductor components, which probe has a probe needle and an essentially prismatic probe shaft, comprises a base having a socket opening, which is designed to receive a prismatic probe shaft and is surrounded by a base wall, and is distinguished by the fact that the base wall comprises at least two base wall segments which can be moved toward one another.

The socket opening which is designed to receive a prismatic probe shaft and is surrounded by a base wall makes it possible to arrange the probe in the test apparatus in a reproducible manner. At the same time, the at least two base wall segments make it possible to firmly clamp the probe shaft of a probe, which is inserted into the socket opening, in the socket opening using the action of external forces. This makes it possible to produce higher clamping forces which remain the same even at high temperatures, thus achieving reliable contact-connection of the probe needle.

According to a first refinement of the invention, the base wall is divided into base wall segments by means of at least two slots which run in the longitudinal direction of the socket opening. In other words, the base wall, which first of all represented a unified body, was then divided into base wall segments by producing slots. The base may thus be formed, for example, from a cylindrical basic body in which a blind hole is made in the axial direction as a socket opening, and the base wall which surrounds the socket opening is subdivided into at least two segments by means of at least two slots, said segments being able to be moved toward one another by means of deformation on account of radially acting external forces.

According to a second refinement of the invention, the base wall is composed of at least two base wall segments which are independent of one another and can be moved toward one another. In other words, the base wall was formed by subsequently joining together individually produced base wall segments. This solution provides for at least that part of the base which forms the socket opening to be formed from a plurality of base wall segments which are independent of one another. As in the first refinement described above, the base wall segments can be rigidly mounted and can be moved toward one another by means of deformation. However, the more complicated design of the base comprising independent base wall segments also makes it possible for said segments to be mounted in a movable manner, in which case spring elements can be provided for the purpose of generating a restoring force which releases the probe shaft situated in the socket opening when no external forces are acting on the base wall segments.

According to another refinement of the invention, provision is also made of at least one clamping means for generating a clamping force that acts on the base wall segments. Although it is, of course, possible to provide a clamping means independently of the probe receptacle and in addition to the latter when the probe receptacle is used in a test apparatus, or to configure the probe receptacle in such a manner that it does not require an additional clamping means, it is nevertheless advantageous to design the clamping means as part of the probe receptacle. This makes it possible to achieve a particularly compact design.

Another refinement of the invention provides for the outer surface of the base to have a conical first region and for the clamping means to be a clamping sleeve whose inner surface has a conical first region, the first region of the clamping sleeve being able to be brought into bearing contact with the first region of the base. In this refinement, the clamping force which externally acts on the base wall segments is generated by displacing the clamping sleeve in the axial direction of the probe receptacle such that the two conical regions of the clamping sleeve and of the base are displaced in the axial direction relative to one another, thus moving the base wall segments in the radial direction. The resultant narrowing of the socket opening exerts a clamping force on the probe shaft which is plugged into the socket opening.

One development of the invention provides for the outer surface of the base to have a cylindrical second region and for the inner surface of the clamping sleeve to have a cylindrical second region which can be moved in the axial direction, that is to say in the longitudinal direction of the socket opening, in the second region of the outer surface of the base. The practice of designing the base and the clamping sleeve such that they each have a cylindrical second region assists the axial relative movement of the clamping sleeve on the base and ensures that the clamping sleeve is guided exactly on the surface of the base.

In order to generate a clamping force from the clamping sleeve onto the outer side of the base, provision may be made for the second region of the outer surface of the base to be provided with an external thread and for the second region of the inner surface of the clamping sleeve to be provided with a corresponding internal thread. The practice of fitting a thread in the respective cylindrical region is relatively simple to implement and produces a probe receptacle which is simple to operate by rotating the clamping sleeve relative to the base. To this end, the clamping sleeve may have, for example, key surfaces for the use of spanners on its outer surface.

Alternatively, in order to provide the required clamping force, provision may be made to also provide a spring which exerts a force, which acts in the axial direction, that is to say in the longitudinal direction of the socket opening, on the clamping sleeve. This design of the inventive probe receptacle ensures that a clamping force is available until the clamping sleeve is displaced in the axial direction counter to the force exerted by the spring. In this case, an additional tool is not required to operate the probe receptacle.

A refinement which is particularly suitable for a cylindrical probe shaft and centers the probe shaft in a highly precise manner provides for three base wall segments to be provided. The three base wall segments are advantageously uniformly distributed over the circumference of the base. The functionality of this refinement corresponds to that of a three-jaw chuck which is known from machine tools.

Provision may advantageously be made for the number of slots to be even. In the simplest case, the base has two slots. The two resulting base wall segments can be clamped in a particularly simple manner if the two slots are arranged such that they are essentially opposite with respect to the socket opening, for example by virtue of the base being surrounded by a clamping collar. This simple solution results in a robust and inexpensive probe receptacle of simple design.

Provision may also advantageously be made to provide four base wall segments. This design has proven to be particularly advantageous when the prismatic probe shaft has a rectangular cross section. The base can be produced in a particularly simple manner when the slots which are present between the base wall segments are opposite one another in pairs with respect to the socket opening.

The object of the invention is also achieved by means of a probe holder arm for mounting a probe in a test apparatus for testing semiconductor components, said probe holder arm being distinguished by the fact that at least one probe receptacle of the type described above is arranged at one end of the probe holder arm. The object is also achieved by means of a test apparatus for testing semiconductor components, said test apparatus having at least one probe and being distinguished by the fact that a probe receptacle of the type described above is provided. In this case, the inventive probe receptacle may, of course, be arranged inside the test apparatus at the free end of a probe holder arm.

BRIEF DESCRIPTION OF THE DRAWING FIGURES

The invention will be explained in more detail below with reference to an exemplary embodiment and associated drawings. In this case, FIG. 1 shows a side view of the inventive probe receptacle, which is arranged at the free end of a probe holder arm, and a sectional illustration through the base of the probe receptacle.

DETAILED DESCRIPTION

Figure 1:
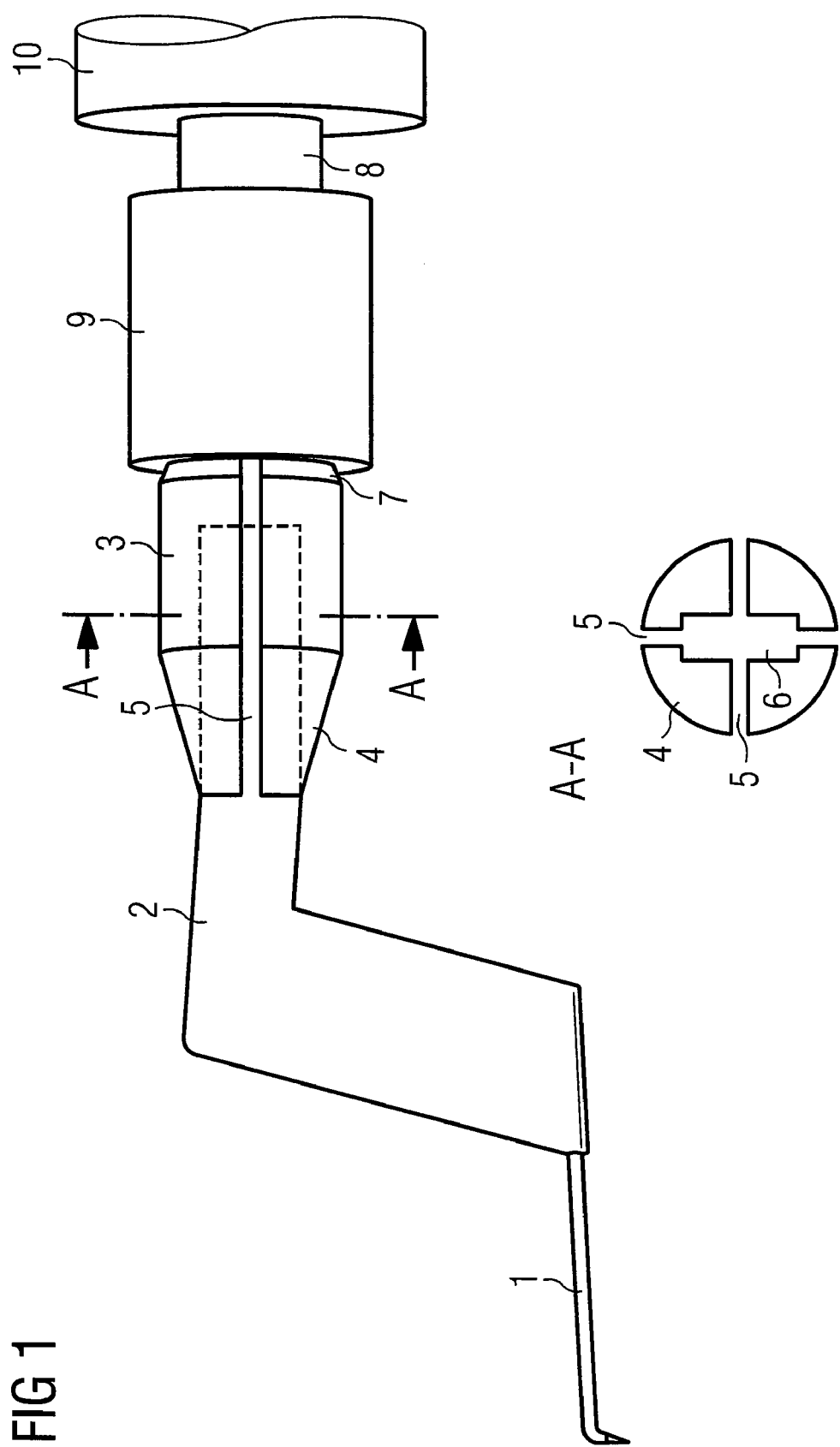

As illustrated in FIG. 1, the inventive probe receptacle is fastened to the free end of a probe holder arm 10 which is arranged in a test apparatus. The probe receptacle comprises a base 3 and a clamping sleeve 9 which sits on the base 3. In order to receive a prismatic probe shaft 2 having a rectangular cross section, a socket opening 6 which likewise has a rectangular cross section is centrally arranged in the base 3. The base 3 is divided into four base wall segments 4 by means of four slots 5 which are arranged such that they are opposite one another with respect to the socket opening 6. In the exemplary embodiment with the socket opening 6 and the slots 5, the base 3 is produced using spark erosion.

The prismatic probe shaft 2 is inserted into the socket opening 6. In the exemplary embodiment, this prismatic probe shaft 2 is angled. The probe needle 1 is arranged at the free end of the probe shaft 2 and is firmly connected to the probe shaft 2. The probe is electrically contact-connected inside the socket opening 6, that is to say in one or more of the four base wall segments 4. To this end, corresponding electrical contacts may be provided inside the socket opening 6. However, since the probe shaft 2 is made from a metallic material in the exemplary embodiment, the contact-connection is directly effected using the base wall segments 4 which likewise comprise metal.

Figure 2:
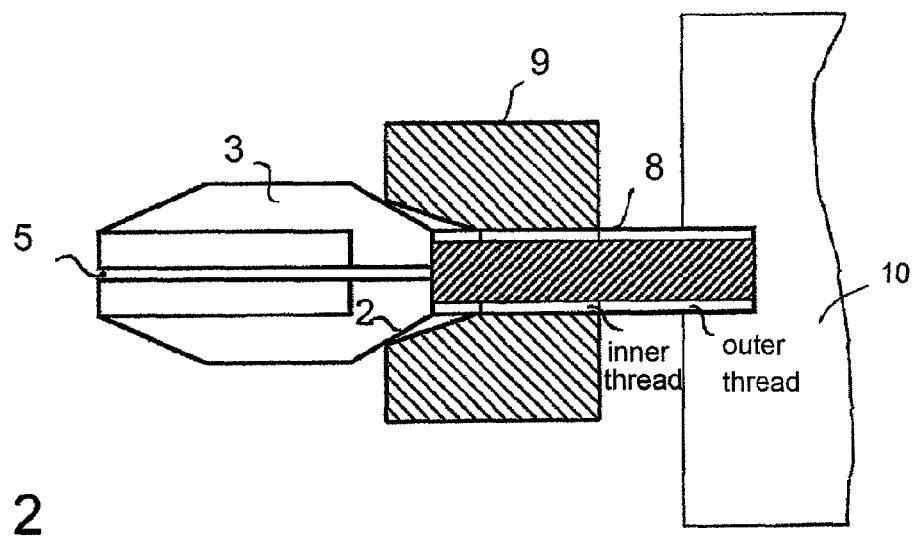
FIG. 2 is a side cross-sectional view illustrating the interaction of a clamping sleeve and the base.

As illustrated in FIG. 2, the base 3 has a first, conical region 7 in the front part of its outer surface and has a second, cylindrical region 8 in the rear part. The clamping sleeve 9 sits on the base 3 and surrounds the latter. The clamping sleeve 9 also has a first, conical region in the front part of its inner surface and a second, cylindrical region in the rear part. The two conical regions 7 of the base 3 and of the clamping sleeve 9 rest against one another. The two cylindrical regions 8 of the base 3 and of the clamping sleeve 9 are provided with threads which match one another.

A clamping force which acts on the prismatic probe shaft 2, which has been inserted into the socket opening 6, is generated by rotating the clamping sleeve 9 relative to the base 3 such that the clamping sleeve 9 is moved back and forth in the axial direction of the base 3. As a result of the interaction of the two conical regions 7 of the clamping sleeve 9 and of the base 3, the base wall segments 4 are moved toward one another in one direction of rotation, with the result that they generate a clamping force, and the clamping force is canceled in the other direction of rotation, with the result that the prismatic probe shaft 2 is released.

Figure 3:
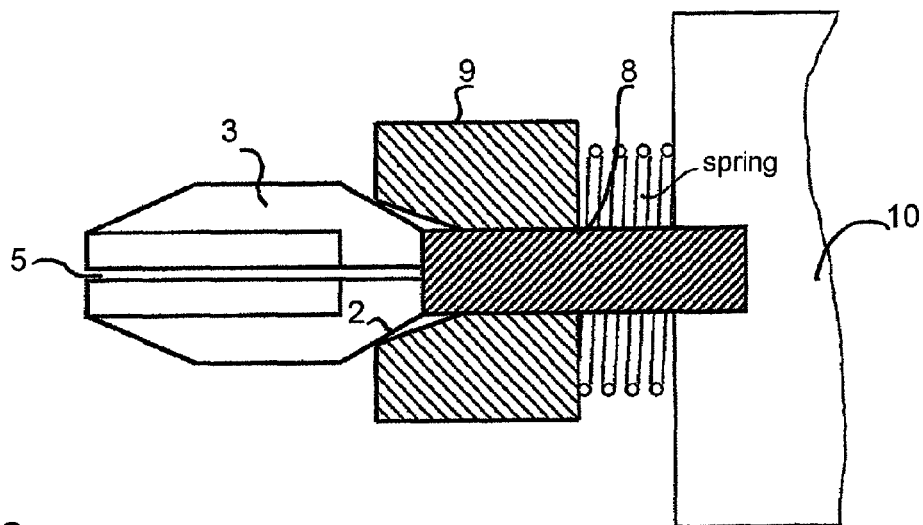
FIG. 3 is a side cross-sectional view of an alternate embodiment employing a spring.

FIG. 3 depicts an alternate embodiment in which clamping sleeve 9 is pressed against the conical region 7 of base 3 by a spring positioned between sleeve 9 and probe holder arm 10. In this embodiment, the spring ensures that a clamping force is available until the clamping sleeve is displaced in the axial direction counter to the force exerted by the spring.

The invention claimed is:

1. A probe receptacle for mounting a probe for testing semiconductor components, which probe has a probe needle and an essentially prismatic probe shaft, said probe receptacle comprising a base having a socket opening, to receive the prismatic probe shaft, the socket opening being surrounded by a base wall, wherein the base wall has at least two base wall segments which can be moved toward one another when the probe shaft has been installed in said socket opening, and an outer surface of the base has a conical first region disposed rearwardly of the base wall segments; and further comprising at least one clamping means interacting with said rearwardly disposed conical first region for generating a clamping force that acts on the base wall segments.

2. The probe receptacle as claimed in claim 1, wherein the base wall is divided into base wall segments by means of at least two slots which run in a longitudinal direction of the socket opening.

3. The probe receptacle as claimed in claim 1, wherein the base wall is composed of at least two base wall segments which are independent of one another and can be moved toward one another.

4. The probe receptacle as claimed in claim 1, wherein said socket opening has a rectangular cross-section with a height greater than width.

5. The probe receptacle as claimed in claim 4, wherein the clamping means comprises a clamping sleeve with an inner surface having a conical first region, the first region of the clamping sleeve being positioned to be brought into bearing contact with the first region of the base.

6. The probe receptacle as claimed in claim 5, wherein the outer surface of the base has a cylindrical second region and the inner surface of the clamping sleeve has a cylindrical second region which can be moved in an axial direction in the second region of the outer surface of the base.

7. The probe receptacle as claimed in claim 6, wherein the second region of the outer surface of the base is provided with an external thread and the second region of the inner surface of the clamping sleeve is provided with a corresponding internal thread.

8. The probe receptacle as claimed in claim 6, further comprising a spring which exerts a force acting in a longitudinal direction of the socket opening, on the clamping sleeve.

9. The probe receptacle as claimed in claim 1, wherein the base wall comprises three base wall segments.

10. The probe receptacle as claimed in claim 1, wherein the number of base wall segments is even.

11. The probe receptacle as claimed in claim 10, wherein the base wall comprise four base wall segments.

12. The probe receptacle as claimed in claim 10, wherein the base wall segments are opposite one another in pairs with respect to the socket opening.

13. A probe holder arm for mounting a probe in a test apparatus for testing semiconductor components, wherein at least one probe receptacle as claimed in claim 1 is arranged at one end of the probe holder arm.

14. A test apparatus for testing semiconductor components, said test apparatus having at least one probe, and a probe receptacle as claimed in claim 1.

15. The probe receptacle as claimed in claim 1, in combination with a probe for testing semiconductor components, the probe comprising a probe needle connected to an angled prismatic probe shaft.

16. The probe receptacle as claimed in claim 15, wherein the probe shaft has a rectangular cross-section and comprises a first segment and a second segment, the first segment being mounted in said socket opening, and the second segment extending at an angle from the first segment.

17. The probe receptacle as claimed in claim 16, wherein said angle is greater than 90°.

18. The claim receptacle as claimed in claim 8, wherein the spring is mounted behind the clamping sleeve and exerts a force on the clamping sleeve in a forward direction.

* * * * *